(12) United States Patent
Chen et al.

(10) Patent No.: US 9,786,543 B2
(45) Date of Patent: Oct. 10, 2017

(54) ISOLATION STRUCTURE OF SEMICONDUCTOR DEVICE

(71) Applicant: Taiwan Semiconductor Manufacturing Company, Ltd., Hsin-Chu (TW)

(72) Inventors: Shu-Han Chen, Hsin-Chu (TW); Cheng-Hsien Wu, Hsin-Chu (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/961,573

(22) Filed: Dec. 7, 2015

(65) Prior Publication Data

US 2016/0086840 A1    Mar. 24, 2016

Related U.S. Application Data

(62) Division of application No. 13/782,105, filed on Mar. 1, 2013, now Pat. No. 9,209,066.

(51) Int. Cl.

| H01L 21/76 | (2006.01) |
|---|---|
| H01L 21/762 | (2006.01) |
| H01L 29/78 | (2006.01) |
| H01L 29/51 | (2006.01) |
| H01L 29/66 | (2006.01) |
| H01L 29/165 | (2006.01) |

(52) U.S. Cl.
CPC .. *H01L 21/76205* (2013.01); *H01L 21/76224* (2013.01); *H01L 29/66795* (2013.01); *H01L 29/785* (2013.01); *H01L 29/7846* (2013.01); *H01L 29/165* (2013.01); *H01L 29/517* (2013.01); *H01L 29/66545* (2013.01)

(58) Field of Classification Search
CPC ............ H01L 21/76205; H01L 21/76224
USPC ........................................... 438/424
See application file for complete search history.

(56) References Cited

U.S. PATENT DOCUMENTS

| 5,266,813 | A | 11/1993 | Comfort et al. |
|---|---|---|---|
| 6,160,314 | A | 12/2000 | Lee et al. |
| 6,482,715 | B2 | 11/2002 | Park et al. |
| 9,209,066 | B2 * | 12/2015 | Chen ................ H01L 21/76205 |
| 2004/0009636 | A1 | 1/2004 | Ichinose et al. |

(Continued)

FOREIGN PATENT DOCUMENTS

| JP | 2004039831 | 2/2004 |
|---|---|---|
| JP | 2008506261 | 2/2008 |

(Continued)

*Primary Examiner* — Caleb Henry
(74) *Attorney, Agent, or Firm* — Slater Matsil, LLP (57) ABSTRACT

The invention relates to an isolation structure of a semiconductor device and a method of forming. An exemplary isolation structure for a semiconductor device comprises a substrate comprising a trench; a strained material in the trench, wherein a lattice constant of the strained material is different from a lattice constant of the substrate; an oxide layer of the strained material over the strained material; a high-k dielectric layer over the oxide layer; and a dielectric layer over the high-k dielectric layer filling the trench.

20 Claims, 7 Drawing Sheets

(56) References Cited

U.S. PATENT DOCUMENTS

| | | | |
|---|---|---|---|
| 2004/0121554 A1* | 6/2004 | Ohnishi | H01L 21/76224 438/429 |
| 2005/0205859 A1 | 9/2005 | Currie et al. | |
| 2005/0260825 A1 | 11/2005 | Koester et al. | |
| 2006/0006436 A1 | 1/2006 | Mouli | |
| 2007/0045753 A1 | 3/2007 | Pae et al. | |
| 2009/0035909 A1 | 2/2009 | Chang et al. | |
| 2009/0096055 A1* | 4/2009 | Montgomery | H01L 21/76232 257/510 |
| 2009/0111238 A1* | 4/2009 | Kim | H01L 21/76224 438/425 |
| 2009/0166750 A1 | 7/2009 | Eda | |
| 2010/0244189 A1 | 9/2010 | Klootwijk et al. | |
| 2011/0140229 A1 | 6/2011 | Rachmady et al. | |
| 2012/0126244 A1* | 5/2012 | Zhong | H01L 29/7846 257/77 |

FOREIGN PATENT DOCUMENTS

| | | |
|---|---|---|
| JP | 2010530128 | 9/2010 |
| KR | 20080025213 | 3/2008 |

\* cited by examiner

ISOLATION STRUCTURE OF SEMICONDUCTOR DEVICE

This application is a divisional application of and claims the benefit of U.S. patent application Ser. No. 13/782,105, filed Mar. 1, 2013, and entitled "Isolation structure of semiconductor device," which application is hereby incorporated herein by reference.

TECHNICAL FIELD

This disclosure relates to integrated circuit fabrication, and more particularly to a semiconductor device with an isolation structure.

BACKGROUND

As the semiconductor industry has progressed into nanometer technology process nodes in pursuit of higher device density, higher performance, and lower costs, challenges from both fabrication and design issues have resulted in the development of three-dimensional designs of a semiconductor device, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over three sides (e.g., wrapping) the fin. Having a gate on both sides of the channel allows gate control of the channel from both sides. In addition, strained materials in source/drain (S/D) portions of the FinFET utilizing selectively grown silicon germanium may be used to enhance carrier mobility.

However, there are challenges to implementation of such features and processes in complementary metal-oxide-semiconductor (CMOS) fabrication. For example, channel mobility of the FinFET significantly decreases if a high-density of defects is generated between the fin structure and isolation structure, thereby degrading the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
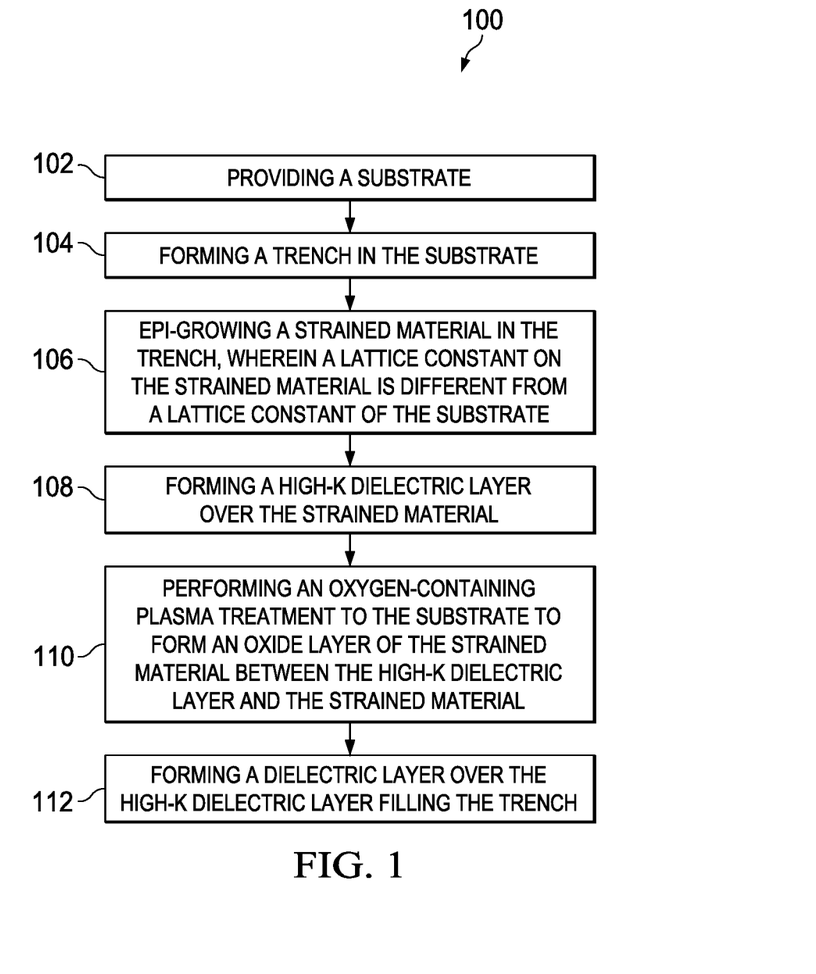
FIG. 1 is a flowchart illustrating a method of fabricating an isolation structure of a semiconductor device according to various aspects of the present disclosure.
Figure 2:
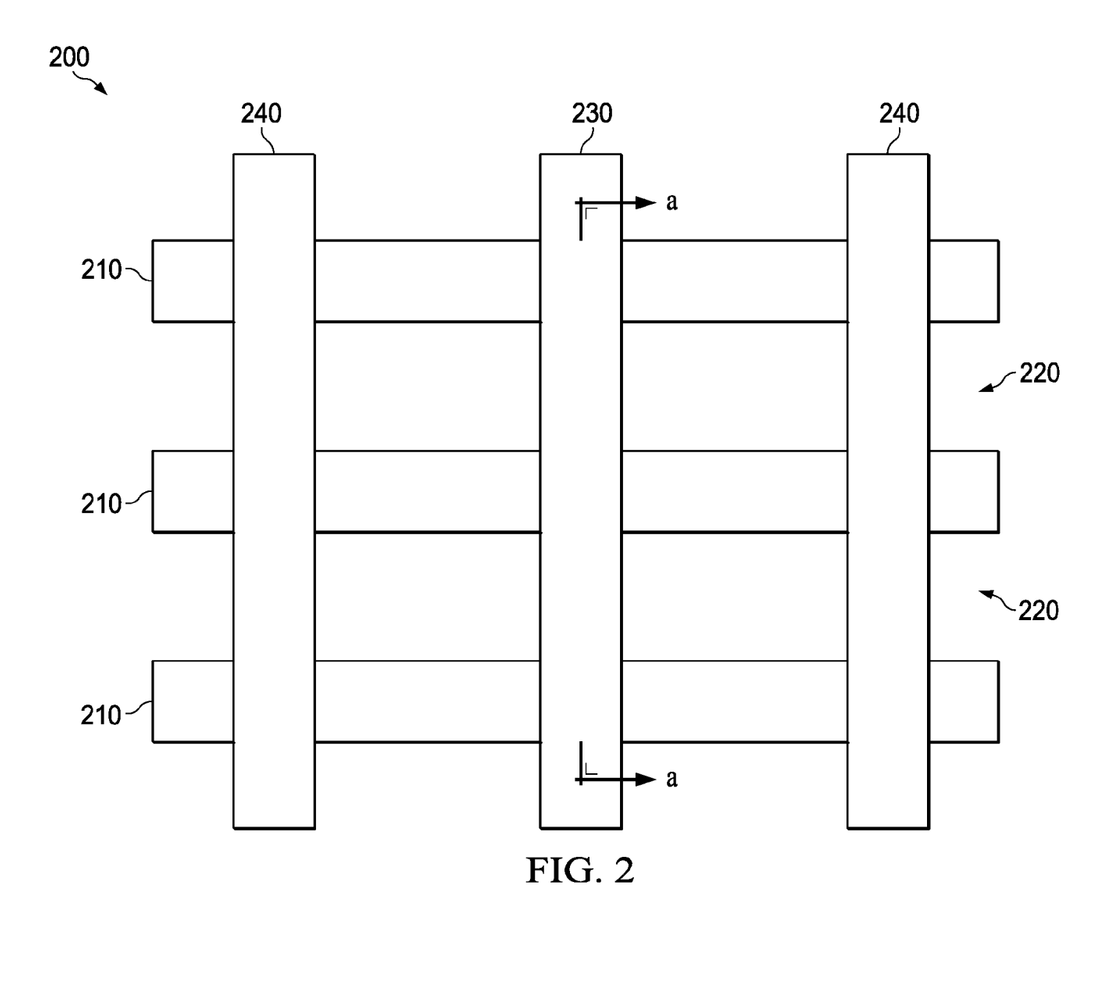
FIG. 2 shows a top view of a semiconductor device comprising an isolation structure according to various aspects of the present disclosure.

FIG. 1 is a flowchart illustrating a method of fabricating an isolation structure of a semiconductor device 200 (shown in FIGS. 11 and 12) according to various aspects of the present disclosure. FIG. 2 shows a top view of a semiconductor device 200 comprising an isolation structure 220 according to various aspects of the present disclosure; and FIGS. 3-12 show cross-section views of the semiconductor device 200 taken along line a-a of FIG. 2 at various stages of fabrication according to various aspects of the present disclosure. As employed in the present disclosure, the term semiconductor device 200 refers to a fin field effect transistor (FinFET). The FinFET refers to any fin-based, multi-gate transistor. Other transistor structures and analogous structures are within the contemplated scope of the disclosure. The semiconductor device 200 may be included in a microprocessor, memory cell, and/or other integrated circuit (IC).

It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 12 are simplified for a better understanding of the concepts of the present disclosure. For example, although the figures illustrate the semiconductor device 200, it is understood the IC may comprise a number of other devices comprising resistors, capacitors, inductors, fuses, etc.

FIG. 2 illustrates a semiconductor device 200 fabricated using the steps in FIG. 1. The semiconductor device 200 comprises a FinFET (also referred to as a FinFET 200 hereafter). For illustration, the FinFET 200 comprises a fin structure 210, an isolation structure 220 surrounding the fin structure 210, and a gate structure 230 traversing over the fin structure 210. In some embodiments, the FinFET 200 further comprises a dummy gate structure 240 adjacent to the gate structure 230 traversing over the fin structure 210. In some embodiments, the FinFET 200 may comprise less than or greater than three fins, for example, one fin or five fins.

Figure 3:
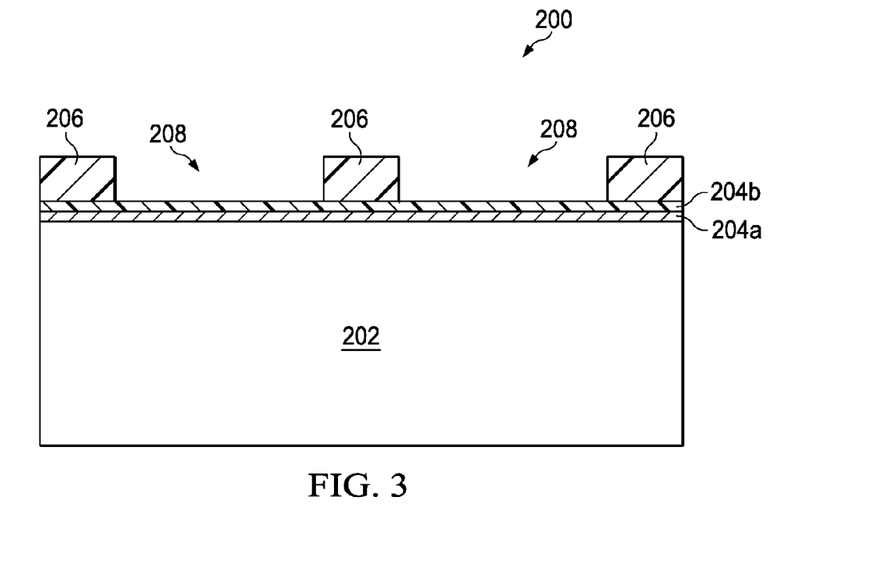
FIGS. 3-12 show cross-section views of the semiconductor device taken along line a-a of FIG. 2 at various stages of fabrication according to various aspects of the present disclosure.

Referring to FIG. 3, the method 100 begins at step 102 wherein a substrate 202 is provided. In at least one embodiment, the substrate 202 comprises a crystalline silicon substrate (e.g., wafer). The substrate 202 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

The substrate 202 may alternatively be made of some other suitable elementary semiconductor, such as diamond or germanium; a suitable compound semiconductor, such as gallium arsenide, silicon carbide, indium arsenide, indium antimonide, or indium phosphide; or a suitable alloy semiconductor, such as silicon germanium carbide, gallium indium arsenide, gallium indium antimonide, gallium arsenide antimonide, gallium arsenic phosphide, or gallium indium phosphide. Further, the substrate 202 may include an epitaxial layer (epi-layer), may be strained or relaxed for performance enhancement, and/or may include a silicon-on-insulator (SOI) structure.

Still referring to FIG. 3, a pad layer 204a and a mask layer 204b are formed on the semiconductor substrate 202. The pad layer 204a may be a thin film comprising silicon oxide formed, for example, using a thermal oxidation process. The pad layer 204a may act as an adhesion layer between the semiconductor substrate 202 and mask layer 204b. The pad layer 204a may also act as an etch stop layer for etching the mask layer 204b. In at least one embodiment, the mask layer 204b is formed of silicon nitride, for example, using low-pressure chemical vapor deposition (LPCVD) or plasma enhanced chemical vapor deposition (PECVD). The mask layer 204b is used as a hard mask during subsequent photolithography processes. A photo-sensitive layer 206 is formed on the mask layer 204b and is then patterned, forming openings 208 in the photo-sensitive layer 206.

Figure 4:
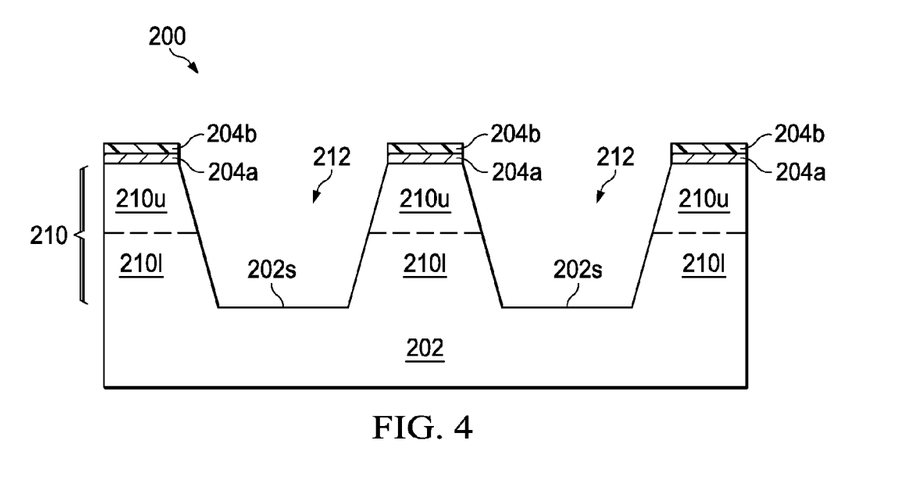

The method 100 in FIG. 1 continues with step 104 in which the structure in FIG. 4 is produced by forming a trench 212 in the substrate 202. In some embodiments, the mask layer 204b and pad layer 204a are etched through openings 208 to expose underlying semiconductor substrate 202. The exposed semiconductor substrate 202 is then etched to form trenches 212 with a major surface 202s (which results from the etch process) of the semiconductor substrate 202. Thus, the trench 212 extends higher than the major surface 202s. In the depicted embodiment, a portion of the semiconductor substrate 202 between trenches 212 forms one semiconductor fin (i.e., the fin structure 210). In other words, the fin structure 210 protrudes from the major surface 202s adjacent to the trench 212. In some embodiments, the fin structure 210 comprises an upper portion 210u and a lower portion 210l (separated by the dashed line), wherein the upper portion 210u and the lower portion 210l comprise the same material, such as silicon. In some embodiments, a strained material replaces material of the upper portion 210u for device performance improvement (shown in FIGS. 10-12).

In some embodiments, the trenches 212 may be continuous and surrounding the fin structure 210 (viewed from in the top of the FinFET 200 in FIG. 2). In an alternative embodiment, the trenches 212 may be strips parallel to each other, and closely spaced with respect to each other (not shown). The trenches 212 each have a width, a depth, and are spaced apart from adjacent trenches by a space. For example, the space between trenches 212 may be smaller than about 30 nm. The photo-sensitive layer 206 is then removed. Next, a cleaning may be performed to remove a native oxide of the semiconductor substrate 202. The cleaning may be performed using diluted hydrofluoric (DHF) acid.

The process steps up to this point have provided the substrate 202 having the trenches 212 surrounding the fin structure 210. Conventionally, the trenches 212 are filled with a dielectric material to form an isolation structure to define and electrically isolate the various fins of the fin structure 210. The dielectric material comprises silicon oxide, silicon nitride, silicon oxynitride, fluoride-doped silicate glass (FSG), a low-K dielectric material, and/or combinations thereof. In some embodiments, the filled trenches 212 may have a multi-layer structure such as a thermal oxide liner layer filled with silicon nitride or silicon oxide. If the upper portion 210u and the lower portion 210l comprise different materials each with different lattice constant, this may produce a defect-free interface between the dielectric material and the lower portion 210l, while causing a high-density of defects generation between the dielectric material and the upper portion 210u with a strained material, thereby decreasing channel mobility of the FinFET.

Accordingly, the processing discussed below with reference to FIGS. 5-12 may fabricate an isolation structure comprising a strained material and an oxide layer of the strained material. Problems associated with a high-density of defects generation between the dielectric material and the upper portion 210u with a strained material may be avoided. Thus, Applicant's method may achieve the device performance characteristics, such as channel mobility.

Figure 5:
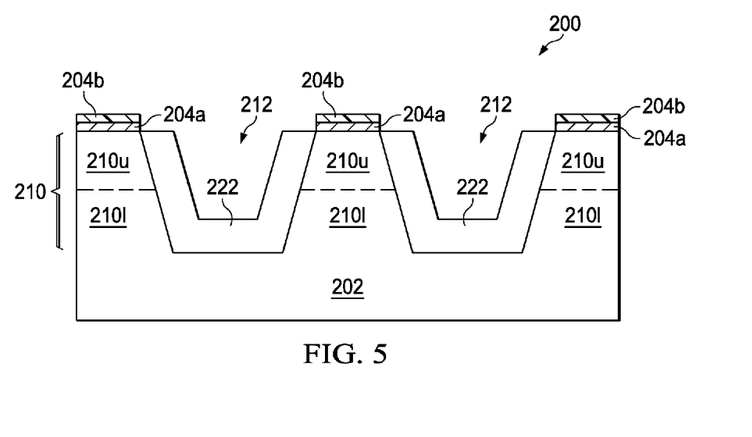

The method 100 in FIG. 1 continues with step 106 in which the structure in FIG. 5 is produced by epi-growing a first strained material 222 in the trench 212, wherein a lattice constant of the first strained material 222 is different from a lattice constant of the substrate 202. In the depicted embodiment, the first strained material 222 comprises Ge or $Si_{1-x}Ge_x$, wherein the x is greater than 0.45. In some embodiments, the first strained material 222 has a thickness ranging from 1 nm to 500 nm.

In a Ge epi-growing embodiment, a pre-cleaning process may be performed to clean the trenches 212 with HF or other suitable solution. Then, the Ge is selectively grown by a low pressure chemical vapor deposition (LPCVD) process to partially fill the trenches 212. In the depicted embodiment, the LPCVD process may be performed under a pressure of about 10 mTorr to 100 mTorr, at a temperature of about 350° C. to 450° C., using $GeH_4$, $GeH_3CH_3$, and/or $(GeH_3)_2CH_2$ as epitaxial gases. Optionally, an anneal process after the epitaxial process is performed at a temperature of about 400° C. to about 850° C. to confine dislocation defects on the interface of the Si and Ge epitaxial layer.

In a $Si_{1-x}Ge_x$ epi-growing embodiment, a pre-cleaning process may be performed to clean the trenches 212 with HF or other suitable solution. Then, the $Si_{1-x}Ge_x$ is selectively grown by an LPCVD process to partially fill the trenches 212. In the depicted embodiment, the LPCVD process is performed at a temperature of about 660° C. to about 700° C. and under a pressure of about 13 Torr to about 50 Torr, using $SiH_2Cl_2$, HCl, $GeH_4$, and $H_2$ as reaction gases. A ratio of a mass flow rate of the $SiH_2Cl_2$ to a mass flow rate of the HCl is in the range of about 0.8 to about 1.5, while a ratio of a mass flow rate of the $SiH_2Cl_2$ to a mass flow rate of the $GeH_4$ is in the range of about 10 to about 50. Optionally, an anneal process after the epitaxial process is performed at a temperature of about 400° C. to about 850° C. to confine dislocation defects on the interface of the Si and $Si_{1-x}Ge_x$ epitaxial layer.

Figure 6:
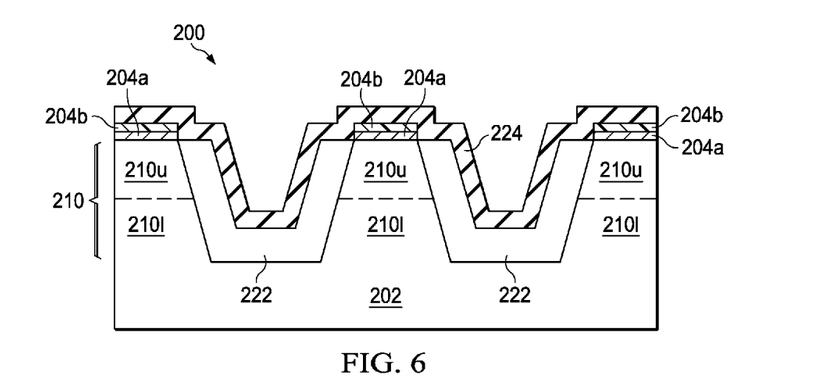

The method 100 in FIG. 1 continues with step 108 in which the structure in FIG. 6 is produced by forming a high-k dielectric layer 224 over the first strained material 222. A high-k dielectric material is defined as a dielectric material with a dielectric constant greater than that of $SiO_2$. In some embodiments, the high-k dielectric layer 224 comprises metal oxides. In some embodiments, the high-k dielectric layer 224 comprises $Al_2O_3$, $ZrO_2$, $HfO_2$, $TaSiO_x$, $LaHfO_x$, or $La_2O_3$. In some embodiments, the high-k dielectric layer 224 has a thickness ranging from 0.1 nm to 3 nm.

The high-k dielectric layer 224 may be formed using a suitable process such as atomic layer deposition (ALD), chemical vapor deposition (CVD), physical vapor deposition (PVD), thermal oxidation, UV-ozone oxidation, or combinations thereof.

Figure 7:
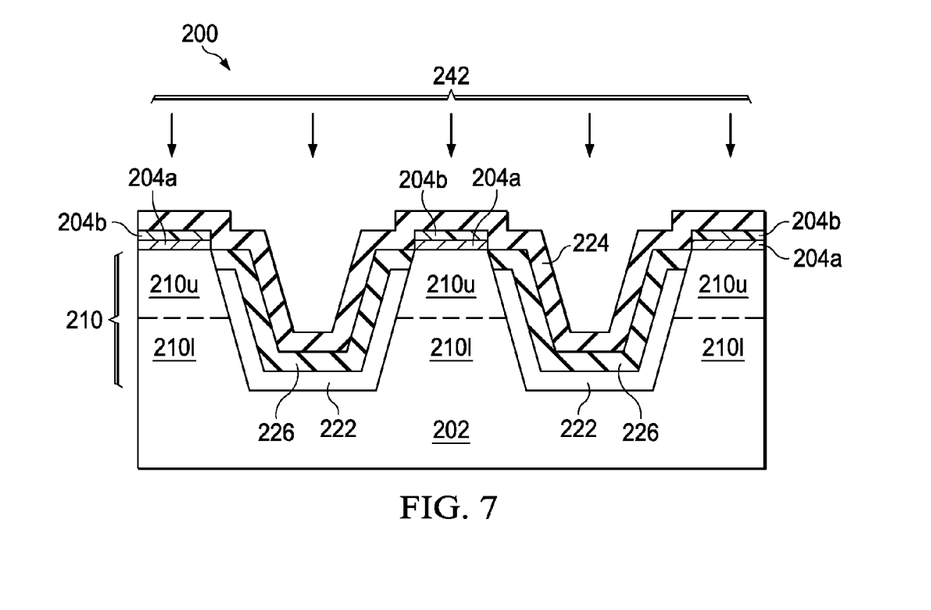

The method 100 in FIG. 1 continues with step 110 in which the structure in FIG. 7 is produced by performing an oxygen-containing plasma treatment 242 to the substrate 202 to form an oxide layer 226 of the first strained material 222 between the high-k dielectric layer 224 and the first strained material 222. In some embodiments, the oxide layer 226 of the first strained material 222 comprises $SiO_2$ or $GeO_2$. In the depicted embodiment, the step of performing an oxygen-containing plasma treatment 242 to the substrate 202 is performed under a source power of about 25 W to about 900 W and a pressure of about 1 Torr to 10 Torr, and at a temperature of about 25° C. to about 400° C., using $O_2$, $O_3$, $H_2O$, $H_2O_2$, NO, or $N_2O$ as an oxygen source gas.

Figure 8:
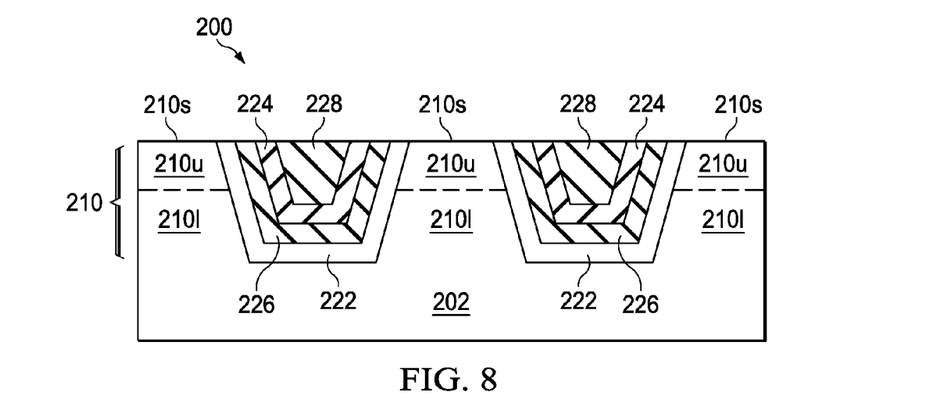
Figure 9:
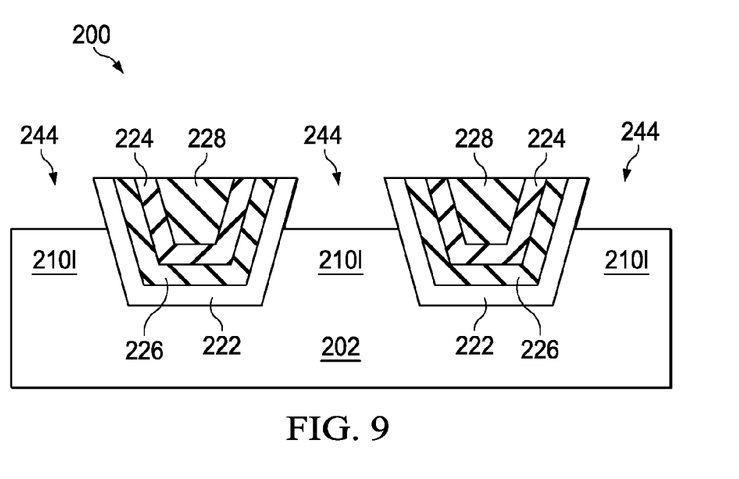

The method 100 in FIG. 1 continues with step 112 in which the structure in FIG. 8 is produced by forming a dielectric layer 228 over the high-k dielectric layer 224 filling or overfilling the trench 212. In some embodiments, the dielectric layer 228 comprise materials such as silicon oxide, silicon nitride, silicon oxy-nitride, fluoride-doped silicate glass (FSG), or a low-k dielectric material. The dielectric layer 228 may be formed using a suitable process such as ALD, CVD, or PVD. A first chemical mechanical polish (CMP) process is then performed until a top surface 210s of the fin structure 210 is exposed or reached, followed by recessing the upper portions 210u of the fin structure 210 by an etching step, resulting in fin trenches 244 to expose the lower portions 210l of the fin structure 210 (shown in FIG. 9). In some embodiments, the etching process may be performed using a solution comprising $NH_4OH$ or tetra-methyl-ammonium hydroxide (TMAH).

Figure 10:
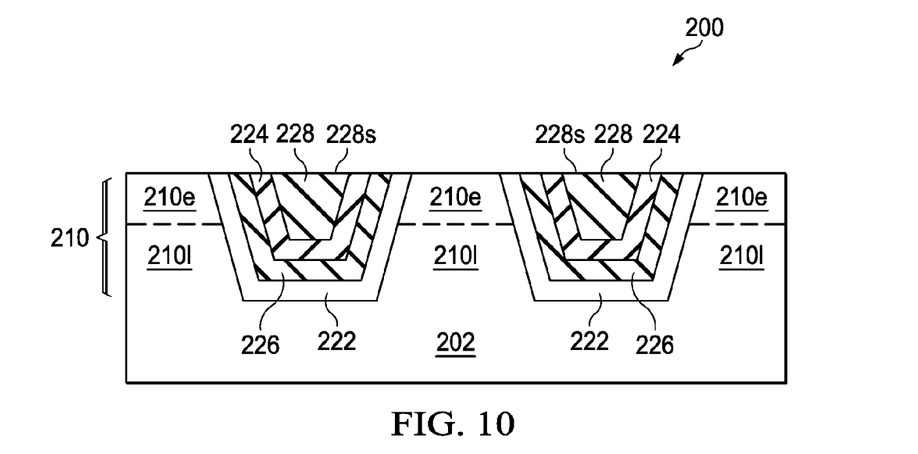

Following formation of the fin trenches 244 to expose the lower portions 210l of the fin structure 210, the structure in FIG. 10 is produced by epi-growing a second strained material 210e in the fin trench 244, wherein a lattice constant of the second strained material 210e is different from a lattice constant of the substrate 202. In some embodiments, the second strained material 210e comprises Ge or $Si_{1-x}Ge_x$, wherein the x is greater than 0.45. In the depicted embodiment, the second strained material 210e and the lower portions 210l of the fin structure 210 are combined and also referred as the fin structure 210.

In a Ge epi-growing embodiment, a pre-cleaning process may be performed to clean the fin trenches 244 with HF or other suitable solution. Then, the Ge is selectively grown by an LPCVD process to fill the fin trenches 244. In the depicted embodiment, the LPCVD process may be performed under a pressure of about 10 mTorr to about 100 mTorr, at a temperature of about 350° C. to about 450° C., using $GeH_4$, $GeH_3CH_3$, and/or $(GeH_3)_2CH_2$ as epitaxial gases. Optionally, an anneal process after the epitaxial process is performed at a temperature of about 400° C. to about 850° C. to confine dislocation defects on the interface of the Si and Ge epitaxial layer.

In a $Si_{1-x}Ge_x$ epi-growing embodiment, a pre-cleaning process may be performed to clean the fin trenches 244 with HF or other suitable solution. Then, the $Si_{1-x}Ge_x$ is selectively grown by an LPCVD process to fill the fin trenches 244. In the depicted embodiment, the LPCVD process is performed at a temperature of about 660 to about 700° C. and under a pressure of about 13 to about 50 Torr, using $SiH_2Cl_2$, HCl, $GeH_4$, and $H_2$ as reaction gases. A ratio of a mass flow rate of the $SiH_2Cl_2$ to a mass flow rate of the HCl is in the range of about 0.8 to about 1.5, while a ratio of a mass flow rate of the $SiH_2Cl_2$ to a mass flow rate of the $GeH_4$ is in the range of about 10 to about 50. Optionally, an anneal process after the epitaxial process is performed at a temperature of about 400° C. to about 850° C. to confine dislocation defects on the interface of the Si and $Si_{1-x}Ge_x$ epitaxial layer.

Figure 11:
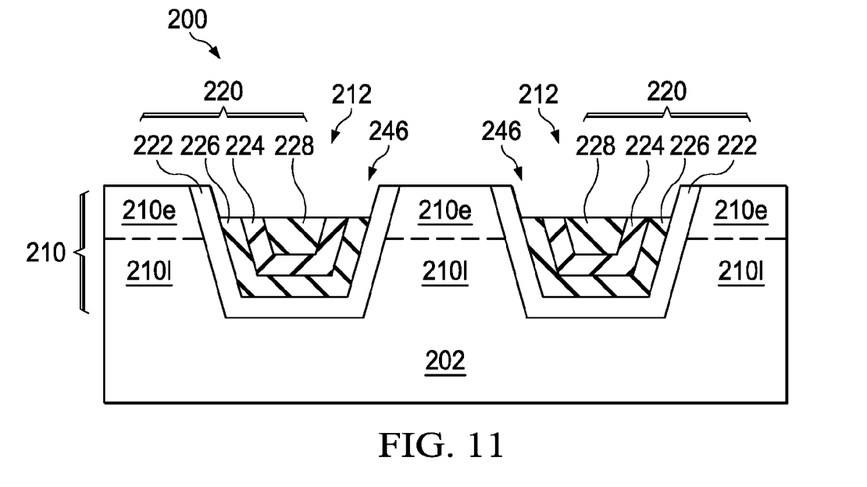

A second CMP process is then performed until a top surface 228s of the dielectric layer 228 is exposed or reached, followed by recessing the dielectric layer 228, the oxide layer 226 of the first strained material 222, and the high-k dielectric layer 224 by an etching step, resulting in recesses 246 to expose a portion of the first strained material 222 (shown in FIG. 11). In one embodiment, the etching step may be performed using a wet etching process, for example, by dipping the substrate 202 in hydrofluoric acid (HF). In another embodiment, the etching step may be performed using a dry etching process, for example, the dry etching process may be performed using $CHF_3$ or $BF_3$ as etching gases.

In the depicted embodiment, the first strained material 222 and the remaining portions of the dielectric layer 228, the oxide layer 226 of the first strained material 222, and the high-k dielectric layer 224 are combined and referred as the isolation structure 220. In other words, the isolation structure 220 comprises the first strained material 222 in the trench 212, wherein the lattice constant of the strained material 222 is different from the lattice constant of the substrate 202; the oxide layer 226 of the first strained material 222 over the first strained material 222; the high-k dielectric layer 224 over the oxide layer 226; and the dielectric layer 228 over the high-k dielectric layer 224 filling the trench 212. In the depicted embodiment, the isolation structure 220 is continuous and surrounding the fin structure 210 (viewed from in the top of the FinFET 200 in FIG. 2).

Figure 12:
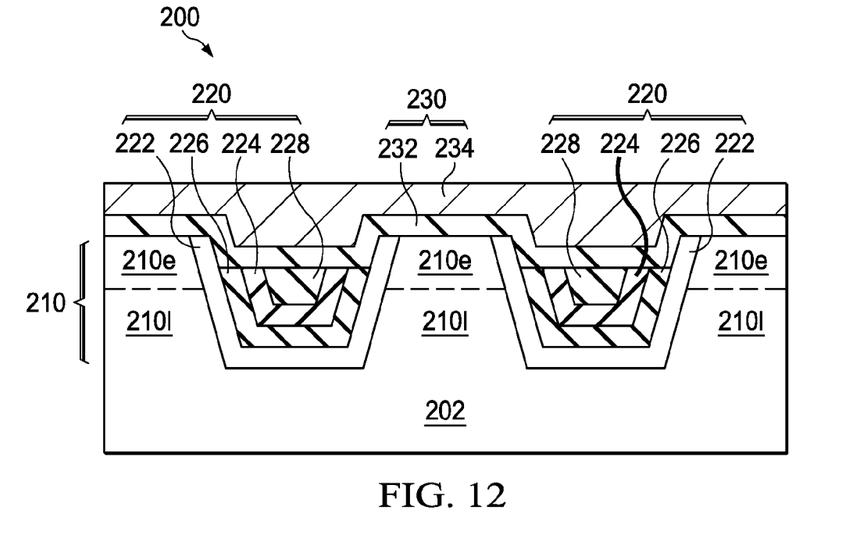

FIG. 12 shows the substrate 202 of FIG. 11 after formation of a gate structure 230 traversing over the fin structure 210. In the depicted embodiment, the gate structure 230 comprises a gate dielectric layer 232 and a gate electrode layer 234 over the gate dielectric layer 232. The gate structure 230 may be formed using any suitable process, including the processes described herein.

In one example, the gate dielectric layer 232 and gate electrode layer 234 are sequentially deposited over the substrate 202. In some embodiments, the gate dielectric layer 232 may include silicon oxide, silicon nitride, silicon oxy-nitride, or high-k dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 232 is a high-k dielectric layer with a thickness in the range of about 1 to about 30 angstroms. The gate dielectric layer 232 may be formed using a suitable process such as ALD, CVD, PVD, thermal oxidation, UV-ozone oxidation, or combinations thereof. The gate dielectric layer 232 may further comprise an interfacial layer (not shown) to reduce damage between the gate dielectric layer 232 and the fin structure 210. The interfacial layer may comprise silicon oxide or germanium oxide.

In some embodiments, the gate electrode layer 234 may comprise a single layer or multilayer structure. In the present embodiment, the gate electrode layer 234 may comprise poly-silicon. Further, the gate electrode layer 234 may be doped poly-silicon with the uniform or non-uniform doping. In some embodiments, the gate electrode layer 234 may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 234 comprises a thickness in the range of about 30 nm to about 60 nm. The gate electrode layer 234 may be formed using a suitable process such as ALD, CVD, PVD, plating, or combinations thereof.

Then, a layer of photoresist (not shown) is formed over the gate electrode layer 234 by a suitable process, such as spin-on coating, and patterned to form a patterned photoresist feature by a proper lithography patterning method. In one embodiment, a width of the patterned photoresist feature is in the range of about 5 to 45 nm. The patterned photoresist feature can then be transferred using a dry etching process to the underlying layers (i.e., the gate electrode layer 234 and the gate dielectric layer 232) to form the gate structure 230. The photoresist layer may be stripped thereafter.

In the depicted embodiment, the gate structure 230 is fabricated using a gate-first process. In an alternative embodiment, the gate structure 230 may be fabricated using a gate-last process. In one embodiment, the gate-last process comprises forming an inter-layer dielectric (ILD) surrounding a dummy gate structure, removing a dummy gate electrode layer to form a trench in the ILD, then filling the trench with a gate electrode layer. In some embodiments, the gate-last process comprises forming an ILD surrounding a dummy gate structure, removing a dummy gate electrode layer and a dummy gate dielectric layer to form a trench in the ILD, then filling the trench with a gate dielectric layer and a gate electrode layer.

After the steps shown in FIG. 1, as further illustrated with respect to the example depicted in FIGS. 3-12, have been performed, subsequent processes, comprising interconnect processing, are performed to complete the FinFET 200 fabrication. It has been observed that the isolation structure 220 comprises the first strained material 222 and an oxide layer 226 of the first strained material 222. Problems associated with a high-density of defects generation between the isolation structure 220 and the fin structure 210 may be avoided. Thus, Applicant's method may achieve the device performance characteristics, such as channel mobility.

In accordance with embodiments, an isolation structure for a semiconductor device comprises a substrate comprising a trench; a strained material in the trench, wherein a lattice constant of the strained material is different from a lattice constant of the substrate; an oxide layer of the strained material over the strained material; a high-k dielectric layer over the oxide layer; and a dielectric layer over the high-k dielectric layer filling the trench.

In accordance with another embodiments, a fin field effect transistor (FinFET) comprises a substrate comprising a major surface and a trench higher than the major surface; a fin structure protruding from the major surface adjacent to the trench; a gate structure traversing over the fin structure; and an isolation structure surrounding the fin structure, wherein the isolation structure comprises a first strained material in the trench, wherein a lattice constant of the first strained material is different from a lattice constant of the substrate; an oxide layer of the first strained material over the first strained material; a high-k dielectric layer over the oxide layer; and a dielectric layer over the high-k dielectric layer filling the trench.

In accordance with another embodiments, a method of fabricating a semiconductor device comprises providing a substrate; forming a trench in the substrate; epi-growing a strained material in the trench, wherein a lattice constant of the strained material is different from a lattice constant of the substrate; forming a high-k dielectric layer over the strained material; performing an oxygen-containing plasma treatment to the substrate to form an oxide layer of the strained material between the high-k dielectric layer and the strained material; and forming a dielectric layer over the high-k dielectric layer filling the trench.

In yet another embodiment, a method of forming a semiconductor device is provided. The method includes forming a trench in the substrate, and epitaxially growing a first epitaxial material in the trench, wherein a lattice constant of the first epitaxial material is different from a lattice constant of the substrate. A first dielectric layer is formed over the first epitaxial material, and after forming the first dielectric layer, converting a portion of the first epitaxial material to a second dielectric layer interposed between the first dielectric layer and the first epitaxial material. A third dielectric layer is formed over the first dielectric layer filling the trench.

In yet still another embodiment, a method of forming a semiconductor device is provided. The method includes forming a trench in a substrate and epitaxially growing a strained material in the trench, wherein a lattice constant of the strained material is different from a lattice constant of the substrate. A high-k dielectric layer is formed over the strained material and a treatment is performed to form an oxide layer of the strained material between the high-k dielectric layer and the strained material. A dielectric layer is formed over the high-k dielectric layer filling the trench.

In yet still another embodiment, a method of forming a semiconductor device is provided. The method includes forming a first trench and a second trench in a substrate and epitaxially growing a first epitaxial material in the first trench and the second trench, wherein a lattice constant of the first epitaxial material is different from a lattice constant of the substrate. A first dielectric layer is formed over the first epitaxial material, and a second dielectric layer of the first epitaxial material is formed between the first dielectric layer and the first epitaxial material. A third dielectric layer is formed over the first dielectric layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, the method comprising:
   forming a trench in a substrate;
   epitaxially growing a first epitaxial material in the trench, wherein a lattice constant of the first epitaxial material is different from a lattice constant of the substrate;
   forming a first dielectric layer over the first epitaxial material;
   after forming the first dielectric layer, converting a portion of the first epitaxial material to a second dielectric layer interposed between the first dielectric layer and the first epitaxial material; and
   after converting the portion of the first epitaxial material to the second dielectric layer, forming a third dielectric layer over the first dielectric layer, the third dielectric layer filling the trench, the third dielectric layer extending into the trench.

2. The method of claim 1, further comprising, after forming the third dielectric layer:
recessing the substrate adjacent the trench; and
epitaxially growing a second epitaxial material on the substrate, the second epitaxial material having a different lattice constant than the substrate.

3. The method of claim 2, further comprising recessing the first dielectric layer, the second dielectric layer, and the third dielectric layer.

4. The method of claim 3, further comprising forming a gate stack over the second epitaxial material.

5. The method of claim 1, wherein converting the portion of the first epitaxial material to the second dielectric layer includes an oxygen-containing plasma treatment using $O_2$, $O_3$, $H_2O$, $H_2O_2$, NO, or $N_2O$ as an oxygen source gas.

6. The method of claim 1, wherein the converting comprises forming an oxide of the first epitaxial material.

7. The method of claim 1, further comprising, prior to epitaxially growing the first epitaxial material, performing a pre-clean process.

8. A method of fabricating a semiconductor device, the method comprising:
forming a trench in a substrate;
epitaxially growing a strained material in the trench, wherein a lattice constant of the strained material is different from a lattice constant of the substrate;
forming a high-k dielectric layer over the strained material;
performing a treatment to form an oxide layer of the strained material between the high-k dielectric layer and the strained material; and
forming a dielectric layer over the high-k dielectric layer filling the trench.

9. The method of claim 8, wherein performing the treatment to the substrate includes an oxygen-containing plasma treatment using $O_2$, $O_3$, $H_2O$, $H_2O_2$, NO, or $N_2O$ as an oxygen source gas.

10. The method of claim 9, wherein the oxygen-containing plasma treatment is performed under a pressure of about 1 Torr to about 10 Torr.

11. The method of claim 9, wherein the oxygen-containing plasma treatment is performed under a source power of about 25 W to about 900 W.

12. The method of claim 8, further comprising recessing the substrate to form a recess adjacent the trench and epitaxially growing another strained material on the substrate in the recess, the another strained material having a different lattice constant than the substrate.

13. The method of claim 12, further comprising performing a planarization process after epitaxially growing the another strained material.

14. The method of claim 13, further comprising:
recessing the high-k dielectric layer, the oxide layer, and the dielectric layer; and
forming a gate stack over the another strained material.

15. A method of fabricating a semiconductor device, the method comprising:
forming a first trench and a second trench in a substrate;
epitaxially growing a first epitaxial material in the first trench and the second trench, wherein a lattice constant of the first epitaxial material is different from a lattice constant of the substrate;
forming a first dielectric layer over the first epitaxial material;
forming a second dielectric layer of the first epitaxial material between the first dielectric layer and the first epitaxial material;
forming a third dielectric layer over the first dielectric layer; and
after forming the third dielectric layer, recessing the substrate between the first trench and the second trench.

16. The method of claim 15, further comprising epitaxially growing a second epitaxial material over the substrate between the first trench and the second trench.

17. The method of claim 16, further comprising recessing the first dielectric layer, the second dielectric layer, and the third dielectric layer.

18. The method of claim 17, further comprising forming a gate dielectric over the second epitaxial material and a gate electrode over the gate dielectric, the first epitaxial material extending between the gate dielectric and the second epitaxial material.

19. The method of claim 18, wherein forming the second dielectric layer is performed at least in part by using an oxygen-containing plasma treatment using $O_2$, $O_3$, $H_2O$, $H_2O_2$, NO, or $N_2O$ as an oxygen source gas.

20. The method of claim 15, further comprising recessing the first dielectric layer, the second dielectric layer, and the third dielectric layer below an upper surface of the first epitaxial material.

* * * * *